United States Patent
Lee

(10) Patent No.: US 11,676,979 B2
(45) Date of Patent: Jun. 13, 2023

(54) IMAGE SENSING DEVICE INCLUDING AIR LAYER BETWEEN COLOR FILTERS

(71) Applicant: SK hynix Inc., Icheon-si (KR)

(72) Inventor: Eun Khwang Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 150 days.

(21) Appl. No.: 17/174,190

(22) Filed: Feb. 11, 2021

(65) Prior Publication Data
US 2021/0399037 A1  Dec. 23, 2021

(30) Foreign Application Priority Data
Jun. 19, 2020 (KR) .......................... 10-2020-0074800

(51) Int. Cl.
*H01L 27/146* (2006.01)

(52) U.S. Cl.
CPC .. *H01L 27/14621* (2013.01); *H01L 27/14685* (2013.01)

(58) Field of Classification Search
CPC ......... H01L 27/14621; H01L 27/14685; H01L 27/14629; H01L 27/14625; H01L 27/14627; H01L 27/1463; H01L 27/14645
See application file for complete search history.

(56) References Cited

U.S. PATENT DOCUMENTS

| | | | |
|---|---|---|---|
| 9,263,485 B2 | 2/2016 | Furuta | |
| 9,728,507 B2 | 8/2017 | He et al. | |
| 2010/0207225 A1* | 8/2010 | Masuda | H01L 31/0232 257/E31.127 |
| 2019/0157329 A1* | 5/2019 | Kim | H01L 27/14621 |

\* cited by examiner

*Primary Examiner* — Nelson Garces
(74) *Attorney, Agent, or Firm* — Perkins Coie LLP

(57) ABSTRACT

Image sensing devices are disclosed. In an aspect, an image sensing device may include an array of sensor pixels to detect incident light to output pixel signals indicative of an image of the incident light, color filters respectively formed over the sensor pixels to filter light incident to the sensor pixels, respectively, and one or more optical grid structures disposed between adjacent color filters. Each of the one or more optical grid structures may include an air layer formed between the color filters and a first capping film structured to cover the air layer and having an open area formed over the air layer and connected to an outside of the color filters.

20 Claims, 11 Drawing Sheets

IMAGE SENSING DEVICE INCLUDING AIR LAYER BETWEEN COLOR FILTERS

CROSS-REFERENCES TO RELATED APPLICATION

The present application claims the priority and benefits of Korean application number 10-2020-0074800, filed on Jun. 19, 2020, which is incorporated herein by reference in its entirety as part of the disclosure of this patent document.

TECHNICAL FIELD

Various embodiments generally relate to an image sensing device including color filters disposed adjacent to each other.

BACKGROUND

An image sensor is a semiconductor device for capturing and converting light of optical images into electrical signals for displaying the captured images and for further processing of the captured images. The development of various industries and sectors, including computer, automotive, medical and communication industries generates various demands for advanced image sensors in various devices and systems such as a smart phone, digital camera, game machine, IOT (Internet of Things), robot, security camera and medical micro camera.

One common type of image sensing devices is a charge coupled device (CCD), which has dominated the field of image sensors for a long time. Another common type of image sensing device is a complementary metal oxide semiconductor (CMOS) image sensing device. CCD image sensors offer a higher image quality and better noise characteristics than CMOS image sensors. However, CMOS image sensors are now widely used due to certain advantages over CCD image sensor, including, e.g., higher frame rates, shutter speed and various scanning methods. In addition, CMOS image sensors and signal processing circuitry can be integrated into a single chip, making it possible to miniaturize electronic devices while achieving low power consumption. Furthermore, using the CMOS fabrication technology can result in reduction in the production costs. Such characteristics make CMOS image sensors better suited for implementations in mobile devices.

SUMMARY

The embodiments of the disclosed technology relate to an image sensing device including a stable grid structure with a low index layer such as an air layer.

In an embodiment, an image sensing device may include an array of sensor pixels to detect incident light to output pixel signals indicative of an image of the incident light, color filters respectively formed over the sensor pixels to filter light incident to the sensor pixels, respectively, and one or more optical grid structures disposed between adjacent color filters. Each of the one or more optical grid structures may include an air layer formed between the color filters and a first capping film structured to cover the air layer and having an open area formed over the air layer and connected to an outside of the color filters.

In an embodiment, an image sensing device may include a semiconductor substrate comprising a first photo-electric conversion element of a first pixel and a second photo-electric conversion element of a second pixel adjacent to the first pixel, the first and second photo-electric conversion element structured to detect incident light to output pixel signals indicative of an image of the incident light, a first color filter and a second color filter disposed over the first and second photo-electric conversion elements, respectively, and adjacent to each other, an optical grid structure disposed between the first and second color filters. The optical grid structure may include an air layer formed between the first and second color filters and a first capping film structured to cover the air layer and having an open area formed over the air layer and connected to an outside of the first and second color filters.

In an embodiment, an image sensing device may include: color filters adjacent to each other, and an optical grid structure disposed between the color filters. The optical grid structure may include an air layer formed between the color filters, and a first capping film configured to cover the air layer, and having an open area formed over the air layer, such that at least a part of the open area is open to external areas of the color filters.

In an embodiment, an image sensing device may include a semiconductor substrate comprising a first photo-electric conversion element of a first pixel and a second photo-electric conversion element of a second pixel adjacent to the first pixel, a first color filter and a second color filter, disposed over the first and second photo-electric conversion elements, respectively, and adjacent to each other, and an optical grid structure disposed between the first and second color filters. The optical grid structure may include an air layer formed between the first and second color filters, and a first capping film configured to cover the air layer, and having an open area formed over the air layer, such that at least a part of the open area is open to external areas of the first and second color filters.

In an embodiment, an image sensing device may include an array of sensor pixels to detect incident light to output pixel signals indicative of an image of the incident light, color filters respectively formed over the sensor pixels to filter light incident to the sensor pixels, respectively, and one or more optical grid structures disposed between adjacent color filters. Each of the one or more optical grid structures may include a low index layer including a low refractive index material and formed between the color filters, and a first capping film structured to cover the air layer and having an open area formed over the low index layer and including a vacant passage connected to an outside of the color filters.

In an embodiment, an image sensing device may include a semiconductor substrate comprising a first photo-electric conversion element of a first pixel and a second photo-electric conversion element of a second pixel adjacent to the first pixel, the first and second photo-electric conversion element structured to detect incident light to output pixel signals indicative of an image of the incident light, a first color filter and a second color filter disposed over the first and second photo-electric conversion elements, respectively, and adjacent to each other, and an optical grid structure disposed between the first and second color filters. The optical grid structure may a low index layer formed between the first and second color filters, and a first capping film structured to cover the air layer and having an open area formed over the low index layer and including a vacant passage connected to an outside of the first and second color filters.

In some embodiments of the disclosed technology, pressure applied to a weak point of a grid structure including an air layer may be distributed to effectively prevent popping at the weak point.

DETAILED DESCRIPTION

Hereafter, various embodiments will be described with reference to the accompanying drawings. However, it should be understood that the disclosed technology is not limited to specific embodiments, but includes various modifications, equivalents and/or alternatives of the embodiments.

Figure 1:
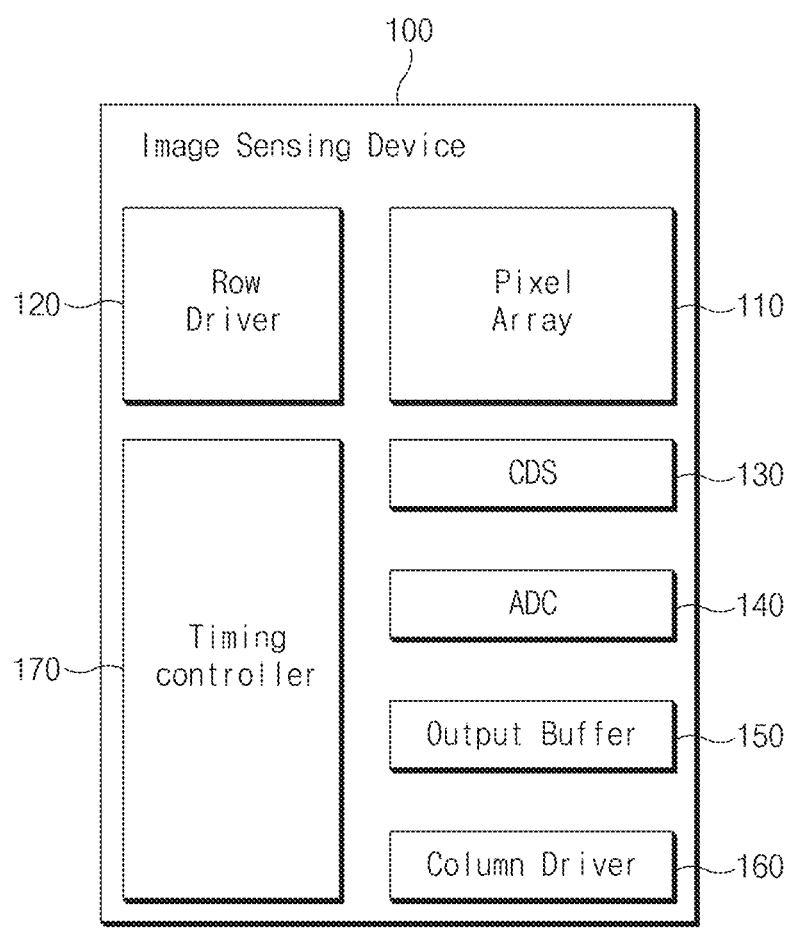
FIG. 1 is a block diagram illustrating an image sensing device based on an embodiment of the disclosed technology.

FIG. 1 is a block diagram illustrating an image sensing device based on an embodiment of the disclosed technology.

Referring to FIG. 1, the image sensing device 100 may include a pixel array 110, a row driver 120, a correlated double sampler (CDS) 130, an analog-digital converter (ADC) 140, an output buffer 150, a column driver 160 and a timing controller 170. The components of the image sensing device 100 illustrated in FIG. 1 are discussed by way of example only, and this patent document encompasses numerous other changes, substitutions, variations, alterations, and modifications.

The pixel array 110 may include a plurality of unit imaging pixels arranged in rows and columns. In one example, the plurality of unit imaging pixels can be arranged in a two dimensional pixel array including rows and columns. In another example, the plurality of unit imaging pixels can be arranged in a three dimensional pixel array. The plurality of unit pixels may convert an optical signal into an electrical signal on a unit pixel basis or a pixel group basis, where unit pixels in a pixel group share at least certain internal circuitry. The pixel array 110 may receive driving signals, including a row selection signal, a pixel reset signal and a transmission signal, from the row driver 120. Upon receiving the driving signal, corresponding imaging pixels in the pixel array 110 may be activated to perform the operations corresponding to the row selection signal, the pixel reset signal, and the transmission signal.

The row driver 120 may activate the pixel array 110 to perform certain operations on the imaging pixels in the corresponding row based on commands and control signals provided by controller circuitry such as the timing controller 170. In some implementations, the row driver 120 may select one or more imaging pixels arranged in one or more rows of the pixel array 110. The row driver 120 may generate a row selection signal to select one or more rows among the plurality of rows. The row driver 120 may sequentially enable the pixel reset signal for resetting imaging pixels corresponding to at least one selected row, and the transmission signal for the pixels corresponding to the at least one selected row. Thus, a reference signal and an image signal, which are analog signals generated by each of the imaging pixels of the selected row, may be sequentially transferred to the CDS 130. The reference signal may be an electrical signal that is provided to the CDS 130 when a sensing node of an imaging pixel (e.g., floating diffusion node) is reset, and the image signal may be an electrical signal that is provided to the CDS 130 when photocharges generated by the imaging pixel are accumulated in the sensing node.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after photocharges generated by incident light are accumulated in the sensing node so that only pixel output voltages based on the incident light can be measured. In some embodiments of the disclosed technology, the CDS 130 may sequentially sample and hold voltage levels of the reference signal and the image signal, which are provided to each of a plurality of column lines from the pixel array 110. That is, the CDS 130 may sample and hold the voltage levels of the reference signal and the image signal which correspond to each of the columns of the pixel array 110.

In some implementations, the CDS 130 may transfer the reference signal and the image signal of each of the columns as a correlate double sampling signal to the ADC 140 based on control signals from the timing controller 170.

The ADC 140 is used to convert analog CDS signals to digital signals. In some implementations, the ADC 140 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 140 may convert the correlate double sampling signal generated by the CDS 130 for each of the columns into a digital signal, and output the digital signal. The ADC 140 may perform a counting operation and a computing operation based on the correlate double sampling signal for each of the columns and a ramp signal provided from the timing controller 170. In this way, the ADC 140 may eliminate or reduce noises such as reset noise arising from the imaging pixels when generating digital image data.

The ADC 140 may include a plurality of column counters. Each column of the pixel array 110 is coupled to a column counter, and image data can be generated by converting the correlate double sampling signals received from each column into digital signals using the column counter. In another embodiment of the disclosed technology, the ADC 140 may include a global counter to convert the correlate double sampling signals corresponding to the columns into digital signals using a global code provided from the global counter.

The output buffer 150 may temporarily hold the column-based image data provided from the ADC 140 to output the image data. In one example, the image data provided to the output buffer 150 from the ADC 140 is stored in the output buffer 150 based on control signals of the timing controller 170. The output buffer 150 may provide an interface to compensate for data rate differences or transmission rate differences between the image sensing device 100 and other devices.

The column driver 160 may select a column of the output buffer upon receiving a control signal from the timing controller 170, and controls the output buffer 150 to sequentially output the image data, which are temporarily stored in the selected column of the output buffer 150. In some implementations, upon receiving an address signal from the timing controller 170, the column driver 160 may generate a column selection signal based on the address signal and select a column of the output buffer 150, outputting the image data as an output signal from the selected column of the output buffer 150.

The timing controller 170 may control operations of the row driver 120, the ADC 140, the output buffer 150 and the column driver 160.

The timing controller 170 may provide the row driver 120, the column driver 160 and the output buffer 150 with a clock signal required for the operations of the respective components of the image sensing device 100, a control signal for timing control, and address signals for selecting a row or column. In an embodiment of the disclosed technology, the timing controller 170 may include a logic control circuit, a phase lock loop (PLL) circuit, a timing control circuit, a communication interface circuit and others.

Figure 2:
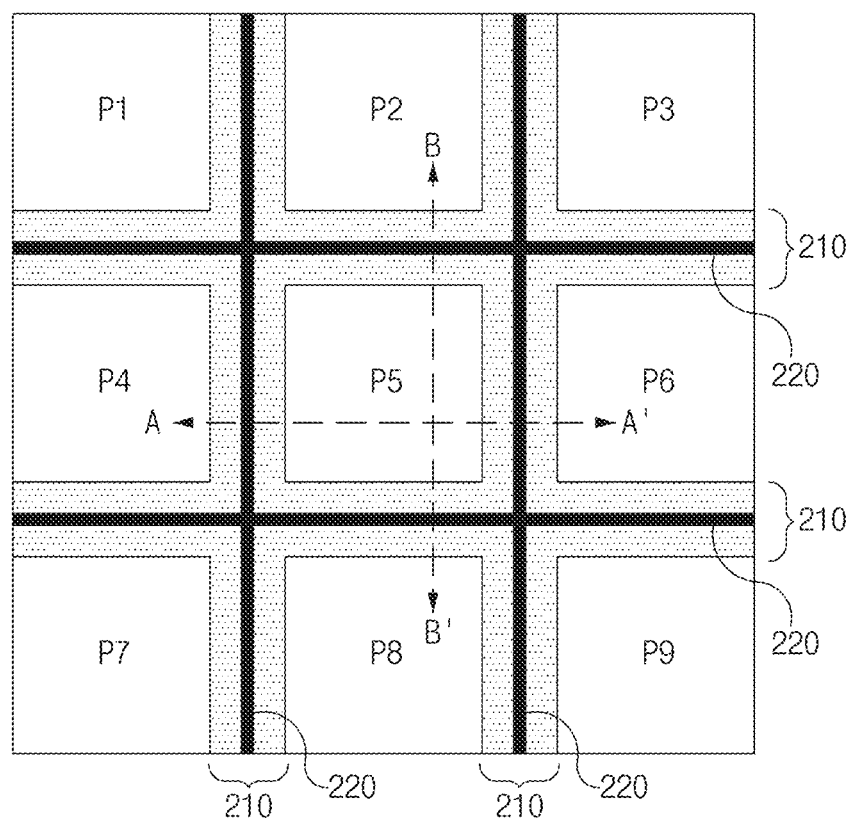
FIG. 2 is a diagram illustrating an example of 3×3 sub-array of the pixel array of FIG. 1.

FIG. 2 is a diagram illustrating an example of 3×3 sub-array of the pixel array of FIG. 1.

Referring to FIG. 2, a 3×3 sub-array 200 is part of the pixel array 110 illustrated by way of example only and may include nine unit pixels P1 to P9 arranged in a 3×3 matrix array. The other unit pixels arranged in the pixel array 110 can be arranged in the same manner as nine unit pixels P1 to P9 illustrated in FIG. 2 and are structured and operable in the same, or similar, manner as the unit pixels P1 to P9. For example, the unit pixels P1 to P9 can be part of a M×N matrix array composed of M rows and N columns, where M and N are positive integers.

Each of the unit pixels P1 to P9 may include an optical grid structure 210 structured to optically isolate each unit pixel from adjacent unit pixels. The optical grid structure 210 may include a low refractive index material such as air therein.

The optical grid structure 210 may be disposed between adjacent pixels. For example, the optical grid structure 210 may be disposed between horizontally adjacent pixels between, e.g., P1 and P2 or P2 and P3. The optical grid structure 210 may also be disposed between vertically adjacent pixels between, e.g., P1 and P4, or P4 and P7. The optical grid structures 210 may be arranged in the row or column direction of the pixel array 110. The optical grid structure 210 may be elongated along sides of unit pixels. In one implementation, the optical grid structure 210 may be a component of each pixel arranged along sides of each pixel to provide an optical isolation. In another implementations, the optical grid structure 210 may be a component that is separate from adjacent pixels and horizontally or vertically arranged between and horizontally or vertically adjacent pixels.

In some implementations, the optical grid structures 210 extend in the row and column directions of the pixel array 110 and are connected to form a mesh structure as a whole. Here, an optical grid structure adjacent to a specific unit pixel may be connected to an adjacent optical grid structure 210, which is adjacent to another unit pixel adjacent to the specific unit pixel.

In some implementations, a color filter (e.g., red, green, blue or yellow color filter) is formed on a corresponding unit pixel disposed between the corresponding optical grid structures 210. In some implementations, the optical grid structure 210 may be structured to surround the color filter of a certain unit pixel.

On a cross-section of a unit pixel, a micro-lens for gathering/converging incident light into the corresponding pixel may be disposed over the color filter, and a substrate including a photo-electric conversion element for converting the intensity of the incident light into an electrical signal may be disposed under the color filter.

When the incident light having passed through the micro-lens passes through the color filter, the incident light having passed through the color filter of a specific pixel may cross over to another pixel through an adjacent color filter, causing an optical crosstalk that is a cause of the noise in a pixel signal. The optical grid structure 210 may reflect such incident light toward the desired pixel or absorb the incident light that otherwise would have crossed over to adjacent pixels, thereby preventing optical crosstalk.

The optical grid structure 210 may include a low refractive index layer such as an air layer and an open area 220 for connecting the air layer to an area positioned outside the color filter, providing an additional structure for preventing the optical crosstalk.

The open area 220 may be a vacant space through which gas can move between the area positioned outside the color filter and the air layer. The location of the open area 220 may vary depending on the shape of the optical grid structure 210. In one example, the open area 220 may be disposed in a shape to surround a certain pixel.

In FIG. 2, a first cutting plane A-A' and a second cutting plane B-B' are illustrated. However, a cross-section taken along the first cutting plane A-A' may be substantially the same as a cross-section taken along the second cutting plane B-B'. Therefore, the examples below will discuss the structure of the optical grid structure 210 based on the cross-section taken along the first or second cutting plane A-A' or B-B' with reference to FIG. 3, and a process for forming the optical grid structure 210 will be described below with reference to FIGS. 4A to 4H.

Figure 3:
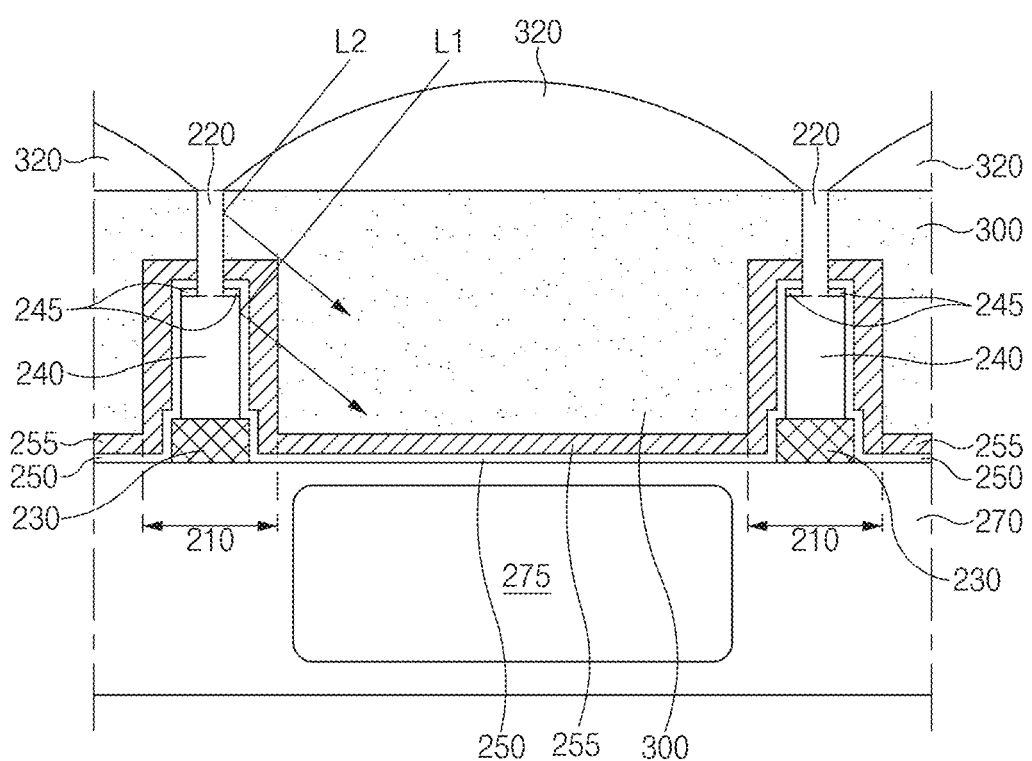
FIG. 3 shows an example of a cross-section taken along a first or second cutting plane of FIG. 2.

FIG. 3 shows an example of a cross-section taken along the first or second cutting plane of FIG. 2.

Referring to FIG. 3, the cross-section taken along the first or second cutting plane A-A' or B-B' shows that the optical grid structures 210 are disposed on both sides and spaced apart from each other by the width of the pixel P5 (see FIG. 2). As described above, the color filter of the pixel P5 may be disposed between the optical grid structures 210 horizontally or vertically adjacent to each other. The height of the top surface of the color filter may be larger or smaller than or equal to the height of the optical grid structure 210.

The cross-section taken along the first or second cutting plane A-A' or B-B' may include a substrate 270, a photo-electric conversion element 275, the optical grid structure 210, a color filter 300 and a micro-lens 320.

The substrate 270 may include top and bottom surfaces facing away from each other. The bottom and top surfaces of the substrate 270 may be defined as a front side and a back side, respectively, but the scope of the disclosed technology is not limited thereto. The substrate 270 may be a P-type or N-type bulk substrate, which can be obtained by growing a P-type or N-type epitaxial layer in a P-type bulk substrate, or by growing a P-type or N-type epitaxial layer in an N-type bulk substrate.

The photo-electric conversion element 275 may generate and accumulate photocharges corresponding to the intensity of incident light. The photo-electric conversion element 275 may be disposed in an area corresponding to the fifth pixel P5 within the substrate 270. The photo-electric conversion element 275 may be formed as an N-type doping area through an ion implantation process of implanting N-type ions. In an embodiment of the disclosed technology, the photo-electric conversion element 275 may include a plurality of doping areas staked on top of each other in the photo-electric conversion element 275. In this case, a lower doping area may be formed by implanting N+ ions, and an upper doping area may be formed by implanting N− ions. The photo-electric conversion element 275 may be formed to occupy a large area to raise a fill-factor, which indicates the ratio of light-sensitive area of a pixel to total pixel area in an image sensor. In an embodiment of the disclosed technology, an isolation film (not illustrated) may be formed between the photo-electric conversion elements of the pixels adjacent to each other. The isolation film may be vertically recessed to electrically and optically isolate the photo-electric conversion elements from each other.

The optical grid structure 210 may include a metal layer 230, an air layer 240, a supporting film 245, a first capping film 250, a second capping film 255 and the open area 220. The relative widths, heights and thicknesses of the respective components included in the optical grid structure 210 are not limited to those illustrated in FIG. 3.

The metal layer 230 may be disposed on the substrate 270. The metal layer 230 may be formed of a metallic material, such as tungsten, having a high light absorption rate. In an embodiment of the disclosed technology, the metal layer 230 may be formed by stacking different or the same metallic materials. In this case, the metal disposed at the bottom of the metal layer 230 may be referred to as a barrier metal. In an embodiment of the disclosed technology, an anti-reflection layer (not illustrated) may be disposed to cover the tops of the substrate 270 and the metal layers 230 included in the pixel array 110. The anti-reflection layer (not illustrated) may have a refractive index between those of the substrate 270 and the color filter 300, in order to compensate for a difference in refractive index between the substrate 270 and the color filter 300. For example, the anti-reflection layer (not illustrated) may be a dielectric film including one or more of silicon oxynitride ($Si_xO_yN_z$), silicon oxide ($Si_xO_y$) and silicon nitride ($Si_xN_y$) where x, y and z are natural numbers.

The air layer 240 may be disposed over the metal layer 230, and the shape of the air layer 240 may be defined by the first capping film 250 and the supporting film 245. The width of the air layer 240 may be smaller than the width of the metal layer 230. Due to the width of the air layer 240, at least a part of the first capping film 250 may be in contact with the top surface of the metal layer 230. Therefore, the structural stability of the air layer 240 may be further improved. In another embodiment of the disclosed technology, the width of the air layer 240 may be equal to the width of the metal layer 230. The air layer 240 may have a relatively low refractive index of 1, for example.

The air layer 240 may be connected to the outside of the color filter 300 through the open area 220 such as the upper areas of the color filter 300 and the micro-lens 320. Therefore, gas can move between the outside of the color filter 300 and the air layer 240.

The supporting film 245 may be formed in an area corresponding to the bottom of the first capping film 250 and the top of the air layer 240, maintaining the shape of the air layer 240. The supporting film may be a dielectric film having no or less light absorption characteristic. For example, the supporting film 245 may be a dielectric film including one or more of silicon oxynitride ($Si_xO_yN_z$), silicon oxide ($Si_xO_y$) and silicon nitride ($Si_xN_y$) where x, y and z are natural numbers.

The supporting film 245 may be formed by removing an area corresponding to the open area 220 from a material layer covering the top surface of the air layer 240. Therefore, the supporting film 245 may be disposed on either side of the open area 220.

The first capping film 250 may be formed to cover the air layer 240, the supporting film 245 and the metal layer 230, except for the open area 220. The first capping film 250 may be formed along the side surfaces of the air layer 240, the supporting film 245 and the metal layer 230 and the top surface of the supporting film 245. For example, the first capping film 250 may be formed of ULTO (Ultra Low Temperature Oxide) such as silicon oxide ($SiO_2$). The first capping film 250 may be formed by removing an area corresponding to the open area 220 from a material layer covering the top surface of the supporting film 245. Therefore, the first capping film 250 may be disposed on either side of the open area 220.

The second capping film 255 may be formed to cover the entire first capping film 250. That is, one side surface of the second capping film 255 may abut on the first capping film 250, and the other side surface of the second capping film 255 may abut on the outside of the optical grid structure 210. For example, the second capping film 255 may be a dielectric film including one or more of silicon oxynitride ($Si_xO_yN_z$), silicon oxide ($Si_xO_y$) and silicon nitride ($Si_xN_y$) where x, y and z are natural numbers. The second capping film 255 may be formed by removing an area corresponding to the open area 220 from a material layer covering the top surface of the first capping film 250. Therefore, the second capping film 255 may be disposed on either side of the open area 220.

In some implementations, the second capping film 255 is thicker than the first capping film 250 because the first capping film 250 needs to be thin enough to drain molecules or discharge gases outside during a plasma process which will be discussed below, and the second capping film 255 is formed to have a thickness enough to provide a structural stability to the shape of the optical grid structure 210 including the air layer 240.

In an embodiment of the disclosed technology, the first and second capping films 250 and 255 may be formed of the same material, and thus have the same refractive index.

In an embodiment of the disclosed technology, the refractive index of the first and second capping films 250 and 255 may be higher than that of the air layer 240, and lower than that of the color filter 300.

The first and second capping films 250 and 255 constituting the optical grid structure (210 on the left side of FIG. 3) disposed on one side of the color filter 300 may extend between the color filter 300 and the substrate 270, and disposed under the color filter 300. Furthermore, the first and second capping films 250 and 255 disposed under the color filter 300 may be connected to the first and second capping films 250 and 255 constituting the optical grid structure 210 disposed on the other side of the color filter 300. That is, the first and second capping films 250 and 255 which constitute the optical grid structure 210 abutting on the color filter 300 may be integrated into one structure with the first and second capping films 250 and 255 disposed under the color filter 300.

Therefore, the first and second capping films 250 and 255 for maintaining the shape of the optical grid structure 210 can be in contact with another component, such as the substrate 270, across a larger area than when the first and second capping films 250 and 255 are not disposed under the color filter 300, which makes it possible to improve the shape stability of the optical grid structure 210. Furthermore, the balance between tensions generated by the first and second capping films 250 and 255 disposed under the color filters 300 on the left and right sides of the optical grid structure 210 can prevent the optical grid structure 210 with a small width from tilting to the left or right.

The first and second capping films 250 and 255 disposed under the color filter 300 may function as an anti-reflection layer which compensates for a difference in refractive index between the color filter and the substrate such that light passing through the color filter 300 can be effectively incident into the substrate. Therefore, although no separate anti-reflection layer is provided between the color filter 300 and the substrate 270, the first and second capping films 250 and 255 may function as the anti-reflection layer, thereby reducing the entire thickness of the unit pixel.

The open area 220 may be disposed between the color filters 300 adjacent to each other while bordering the boundaries of each of the color filters 300. The open area 220 may be a vacant space through which gas can move between the external area of the color filter 300 and the air layer 240. That is, the open area 220 may abut on the top surface of the air layer 240 and the outside of the color filter 300, and filled with a low index material such as air (e.g., the air layer 240). The external area of the color filter 300 may indicate an area where nothing is in the open area 220 or disposed over the micro-lens 320 except air.

The open area 220 may have a smaller width than the air layer 240. The width of the open area 220 may be experimentally decided so that the shape stability of the optical grid structure 210 can be secured while facilitating the passage of gas.

The height of the open area 220 may indicate a distance from the top surface of the air layer 240 to the top surfaces of the color filters 300.

The open area 220 may include an area where at least parts of the supporting film 245, the first capping film 250 and the second capping film 255 are opened up to the outside at the top of the air layer 240, and an area formed by spacing adjacent color filters 300 apart from each other by a predetermined distance. Therefore, the open area 220 may be disposed between the first capping films 250 disposed on both sides of the air layer 240 or between the second capping films 255 disposed on both sides of the air layer 240. Furthermore, the supporting film 245 and the color filters 300 may be disposed on both sides of the open area 220 while abutting on the open area 220. In other words, the open area 220 disposed between the first capping films 250 disposed on both sides of the air layer 240 may extend upwardly toward the external areas of the color filters 300 while abutting on the second capping films 255 and the color filters 300, and extend downwardly toward the air layer 240 while abutting on the supporting film 245.

The optical grid structure 210 may prevent light incident on a color filter (e.g., the color filter of the pixel P5) from moving to another color filter (e.g., the color filter of the pixel P4), thereby minimizing optical crosstalk.

Specifically, since the refractive index (e.g., 1) of the air layer 240 is lower than the refractive index (e.g., 1.6 to 1.7) of the color filter 300 and the refractive indexes (e.g., 1.4) of the first and second capping films 250 and 255, the air layer 240 may reflect the incident light L1 that has passed through the micro-lens 320, the color filter 300 and the first and second capping films 250 and 255 toward the photo-electric conversion element 275.

Furthermore, since the refractive index (e.g., 1) of the open area 220, which is filled with air, is lower than the refractive index (e.g., 1.6 to 1.7) of the color filter 300, the open area 220 may also reflect the incident light L2 having passed through the micro-lens 320 and the color filter 300 toward the photo-electric conversion element 275.

Although some of incident light rays that are not reflected by the air layer 240 and the open area 220 can be refracted into the air layer 240, depending on various incident angles, those light rays may be absorbed by the metal layer 230, which makes it possible to prevent optical crosstalk.

Suppose that the structure illustrated in FIG. 3 is formed without the open area 220 and thus the air layer 240 does not have a passage for gases traveling between the air layer 240 and the outside, and the entire air layers 240 of the pixel array 110 are connected as one area.

In this case, since the first and second capping films 250 and 255 are thin films that cannot withstand high pressure, the volume changes in the air layer can result in internal stresses, causing damage to the first and second capping films 250 and 255. For example, changes in the temperature and volume of the air in the air layer 240 increase internal stresses, and can cause damage to the first and second capping films 250 and 255. When the air layers of the pixel array 110 are connected to each other without the passage for molecules/gases, the internal stresses created by the volume changes of the air may be concentrated on weak portions of the thin film.

However, since the first and second capping films 250 and 255 implemented based on some embodiments of the disclosed technology have passages for the air from the air layer 240 that is connected to the outside through the open area 220 in the optical grid structure 210, the air in the air layer 240 can drain to the outside when the volume of the air inside the air layer 240 increases, preventing damage to the first and second capping films 250 and 255.

The color filters 300 adjacent to each other may be optically isolated from each other by the open area 220, the air layer 240 and the metal layer 230.

The color filter 300 may be formed between the optical grid structures 210 adjacent to each other over the substrate 270, and filter a specific wavelength of light (e.g., wavelength corresponding to red, green, blue, magenta, yellow, cyan or other color). In an embodiment of the disclosed technology, the color filter 300 may be omitted or replaced with an IR (Infrared Ray) pass filter, when the unit pixel P5 is a depth pixel. The color filter 300 may be formed cover the second capping film 255 except the open area 220.

The micro-lens 320 may be formed over the color filter 300 to converge incident light, thereby improving the light receiving efficiency of the photo-electric conversion element 275.

FIGS. 4A to 4H show an example of a process of forming the optical grid structure illustrated in FIG. 3.

In some implementations, the grid structure 210 illustrated in FIG. 3 can be formed as discussed below with reference to FIGS. 4A to 4H. The cross-section illustrated in each of FIGS. 4A to 4H corresponds to the cross-section taken along the first or second cutting plane A-A' or B-B' of FIG. 2.

Figure 4A:
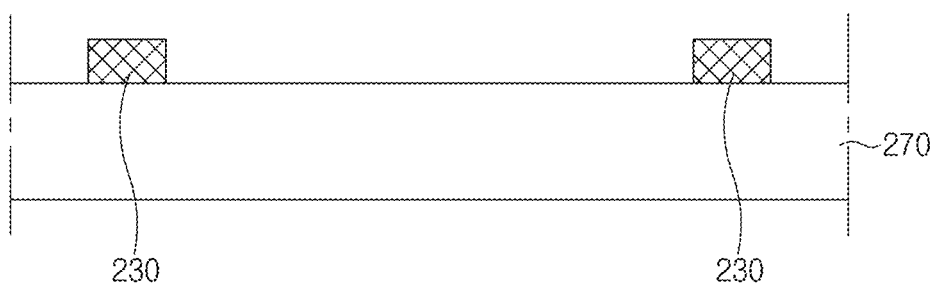
FIGS. 4A to 4H show an example of a process of forming an optical grid structure illustrated in FIG. 3.

Although not illustrated, the metal layer 230 may be formed over the substrate 270 having the photo-electric conversion element 275 formed therein through a deposition process and an etching process, at S10 in FIG. 4A. The height of the metal layer 230 may correspond to the height of the metal layer 230 of the optical grid structure 210. For example, the substrate 270 may be a P-type or N-type bulk substrate obtained by growing a P-type or N-type epitaxial layer in a P-type bulk substrate, or obtained by growing a P-type or N-type epitaxial layer in an N-type bulk substrate.

In an embodiment of the disclosed technology, an anti-reflection layer (not illustrated) may be disposed to cover the tops of the metal layer 230 and the substrate 270.

Figure 4B:
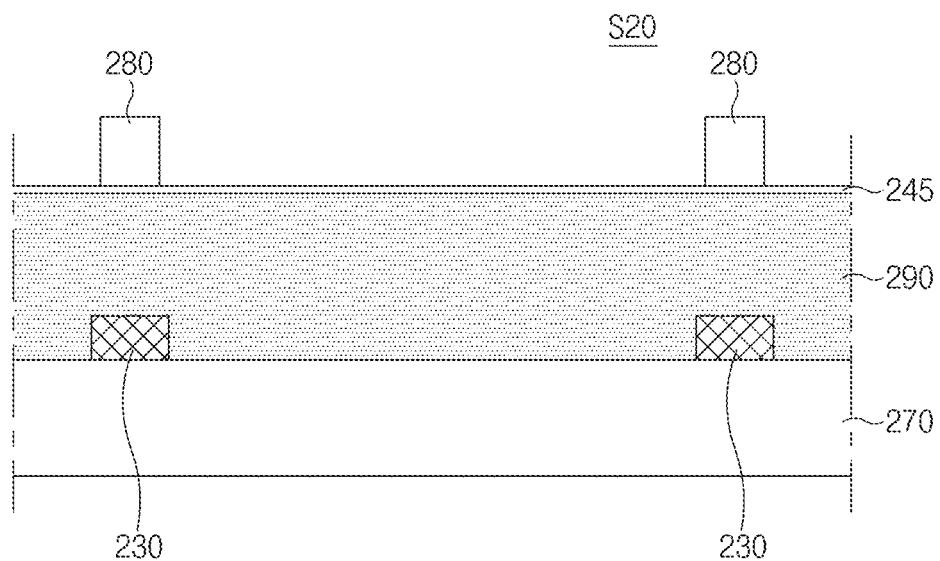

At S20 in FIG. 4B, a sacrificial layer 290 and the supporting film 245 may be sequentially formed over the metal layer 230 and the substrate 270 through a deposition process. The sacrificial layer 290 may include an SOC (Spin On Carbon) film containing carbon. The supporting film 245 may be a dielectric film including one or more of silicon oxynitride ($Si_xO_yN_z$), silicon oxide ($Si_xO_y$) and silicon nitride ($Si_xN_y$) where x, y and z are natural numbers.

Then, a first mask pattern 280 may be disposed over the supporting film 245 to define the optical grid structure 210. The first mask pattern 280 may include a photoresist pattern. The first mask pattern 280 may be extended vertically toward the supporting film 245, and form a right angle with the plane of the supporting film 245.

Figure 4C:
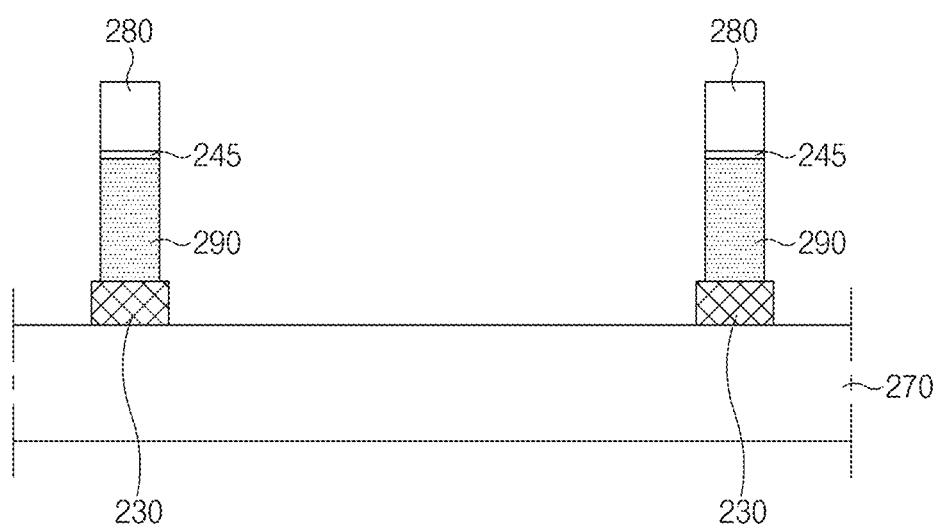

At S30 in FIG. 4C, the sacrificial layer 290 and the supporting film 245 may be etched using the first mask pattern 280 as an etching mask to remove the sacrificial layer 290 and the supporting film 245 disposed in a unit pixel area, leaving the optical grid structure 210. As illustrated in FIG. 3, when the width of the air layer 240 is smaller than the width of the metal layer 230, a second etching process may be performed after a first etching process discussed above. In one example, the first etching process may be performed to the extent of the height of the metal layer 230, using a second mask pattern (not illustrated) corresponding to the width of the metal layer 230 as an etching mask, and then the second etching process may be performed using the first mask pattern 280 corresponding to the width of the air layer 240 as an etching mask, until the sacrificial layer 290 over the substrate 270 is removed.

Subsequently, the first mask pattern 280 may be removed. When step S30 is completed, the sacrificial layer 290 corresponding to the shape of the air layer 240 included in the optical grid structure 210 may be formed.

Figure 4D:
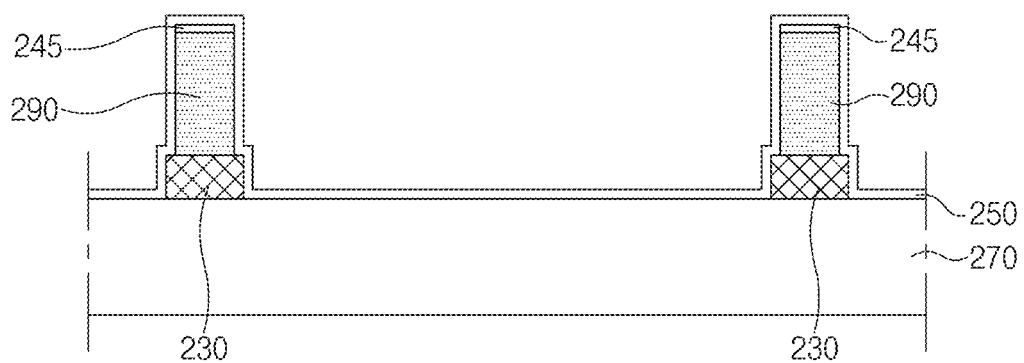

At S40 in FIG. 4D, the first capping film 250 may be formed on the surfaces of the substrate 270, the metal layer 230, the sacrificial layer 290 and the supporting film 245 through a deposition process. The first capping film 250 may include oxide such as ULTO. The first capping film 250 may be formed to be thin enough to drain, to the outside, molecules generated while gas used in a subsequent plasma process and carbon of sacrificial layers 290 are combined.

Figure 4E:
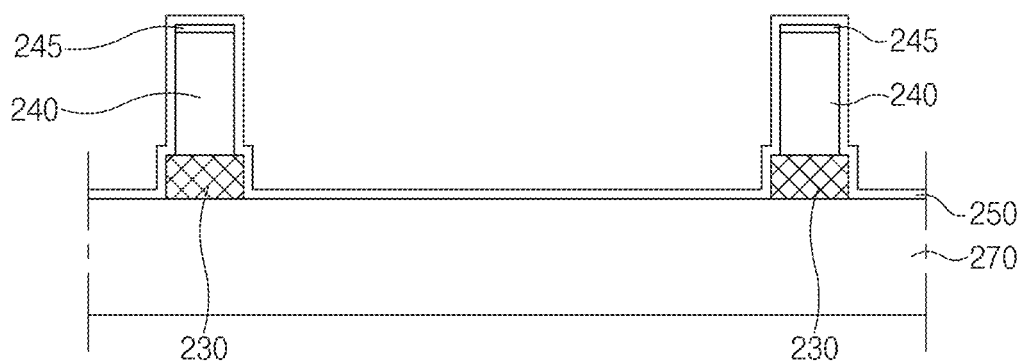

At S50 in FIG. 4E, the sacrificial layer 290 may be removed through the plasma process after the first capping film 250 is formed, and the air layer 240 may be formed at a position corresponding to the sacrificial layer 290. The plasma process may indicate a plasma process using gas containing one or more of oxygen, nitrogen and hydrogen, such as $O_2$, $N_2$, $H_2$, CO, $CO_2$ and $CH_4$. In an example where $O_2$ plasma process is used, oxygen radicals (O*) are introduced into the sacrificial layer 290 through the first capping film 250 and are combined with carbon of the sacrificial layer 290 to generate CO or $CO_2$. The generated CO or $CO_2$ escapes to the outside through the first capping film 250. Through such a process, the sacrificial layer 290 may be removed, and the air layer 240 may be formed at the position from which the sacrificial layer 290 has been removed.

Figure 4F:
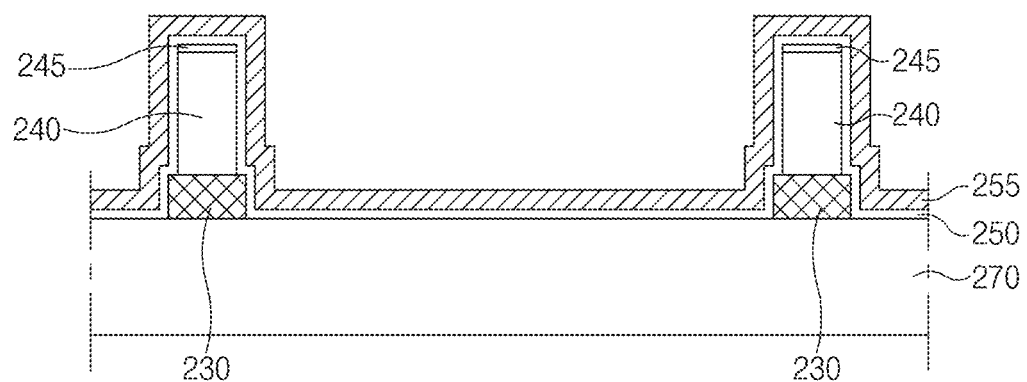

At S60 in FIG. 4F, the second capping film 255 may be formed over the first capping film 250 through a deposition process after the plasma process has been completed. For example, the second capping film 255 may be a dielectric film including one or more of silicon oxynitride ($Si_xO_yN_z$), silicon oxide ($Si_xO_y$) and silicon nitride ($Si_xN_y$) where x, y and z are natural numbers. The thickness of the second capping film 255 may be larger than the thickness of the first capping film 250, and formed to have a thickness required for stably maintaining the shape of the optical grid structure 210.

Figure 4G:
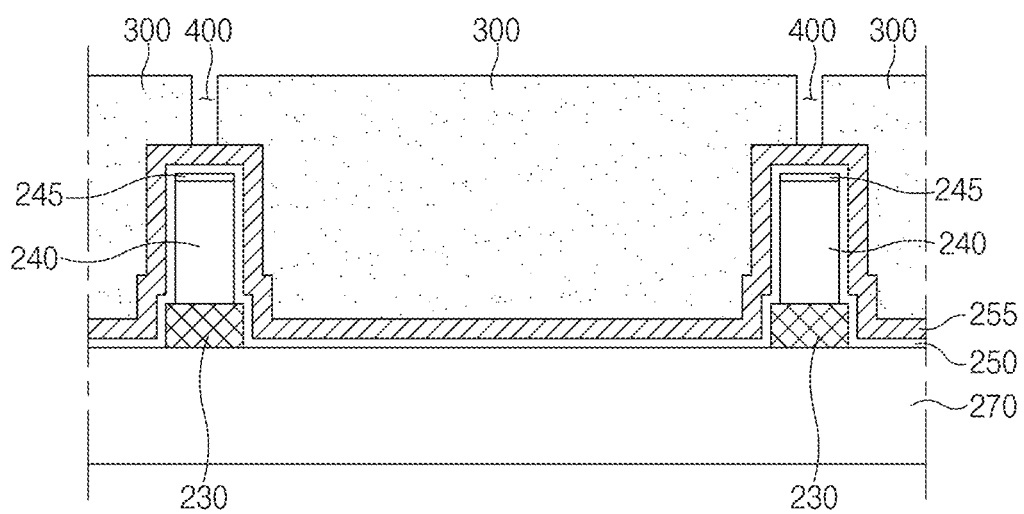

At S70 of FIG. 4G, the color filter 300 may be disposed on the top and side surfaces of the second capping film 255. The color filter 300 may be formed to filter light at a certain wavelength corresponding to the color filter of each pixel. That is, the wavelength of light passing through the color filter 300 disposed in the fifth pixel P5 may be different from those of the fourth or sixth pixel P4 or P6.

A gap 400 may be formed between adjacent color filters 300, to have a predetermined interval at the boundaries between the color filters 300 adjacent to each other. That is, adjacent color filters 300 may be spaced apart from each other by a predetermined distance by leaving the gap 400 when the color filters 300 are formed. The predetermined interval may be set to a minimum interval through which an etchant for a subsequent etching process can pass.

Figure 4H:
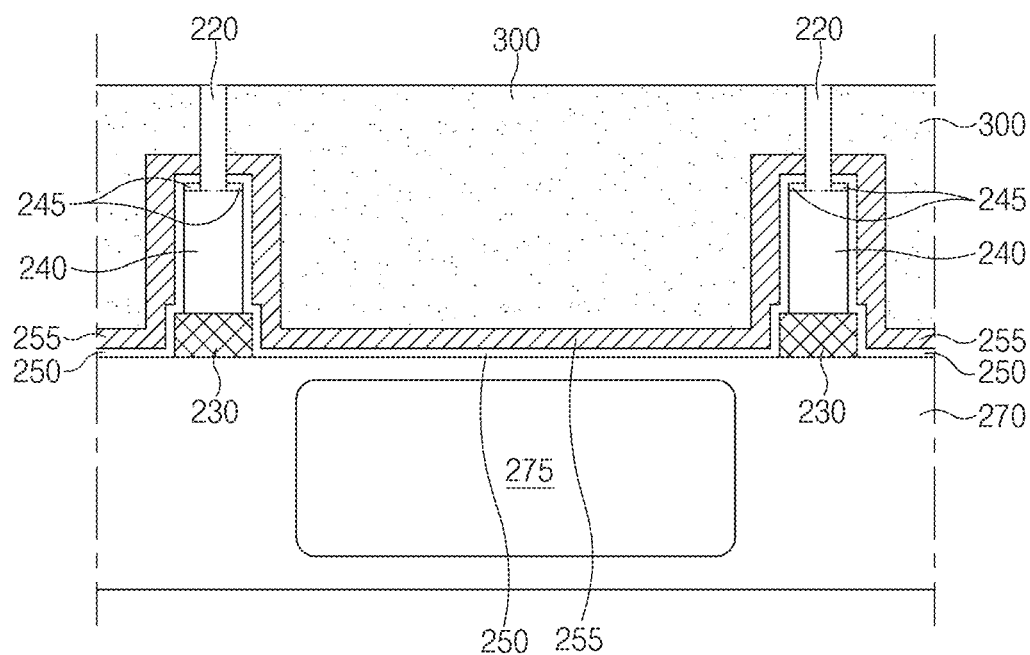

At S80 in FIG. 4H, parts of the supporting film 245, the first capping film 250 and the second capping film 255, which have covered the air layer 240, may be removed through an etching process for injecting an etchant into the gap 400 between the color filters 300 adjacent to each other. The parts of the supporting film 245, the first capping film 250 and the second capping film 255, which are removed through the etching process, may correspond to the bottom of the gap 400.

The parts of the supporting film 245, the first capping film 250 and the second capping film 255 may be removed to form the open area 220 that connects the air layer 240 and the top of the color filter 300.

Subsequently, the micro-lens 320 may be deposited on the top of the color filter 300.

While various embodiments have been described above as specific examples for implementing those embodiments, variations and modifications of those embodiments and other embodiments can be made based on what is disclosed and illustrated in this patent document.

What is claimed is:

1. An image sensing device comprising:
an array of sensor pixels to detect incident light to output pixel signals indicative of an image of the incident light;
color filters respectively formed over the sensor pixels to filter light incident to the sensor pixels, respectively; and
one or more optical grid structures disposed between adjacent color filters,
wherein each of the one or more optical grid structures comprises:
an air layer formed between the color filters; and
a first capping film structured to cover the air layer and having an open area formed over the air layer and connected to an outside of the color filters, and
wherein the open area extends toward the outside of the color filters.

2. The image sensing device of claim 1, wherein the width of the open area is smaller than that of the air layer.

3. The image sensing device of claim 1, wherein the open area is arranged to border boundaries of each of the adjacent color filters.

4. The image sensing device of claim 1, wherein the optical grid structure further comprises a second capping film to cover the first capping film.

5. The image sensing device of claim 4, wherein the open area extends toward the outside of the color filters and arranged to border a boundary of the second capping film.

6. The image sensing device of claim 4, wherein, under the color filter abutting on the optical grid structure, the first and second capping films are stacked to be integrated with the first and second capping films of the optical grid structure.

7. The image sensing device of claim 1, wherein the optical grid structure further comprises a supporting film disposed between the first capping film and the air layer.

8. The image sensing device of claim 7, wherein the open area extends toward the air layer and arranged to border a boundary of the supporting film.

9. The image sensing device of claim 1, wherein the first capping film is formed of ultra-low temperature oxide.

10. The image sensing device of claim 1, wherein a refractive index of the first capping film is higher than that of the air layer and lower than that of the color filter abutting on the optical grid structure.

11. The image sensing device of claim 1, wherein the optical grid structure further comprises a metal layer disposed under the air layer.

12. The image sensing device of claim 11, wherein the width of the metal layer is larger than that of the open area.

13. An image sensing device comprising:
a semiconductor substrate comprising a first photo-electric conversion element of a first pixel and a second photo-electric conversion element of a second pixel adjacent to the first pixel, the first and second photo-electric conversion element structured to detect incident light to output pixel signals indicative of an image of the incident light;
a first color filter and a second color filter disposed over the first and second photo-electric conversion elements, respectively, and adjacent to each other; and
an optical grid structure disposed between the first and second color filters,
wherein the optical grid structure comprises:
an air layer formed between the first and second color filters; and
a first capping film structured to cover the air layer and having an open area formed over the air layer and connected to an outside of the first and second color filters, and
wherein the open area is structured to drain air in the air layer to the outside of the first and second color filters.

14. The image sensing device of claim 13, wherein the optical grid structure further comprises a metal layer disposed under the air layer.

15. The image sensing device of claim 14, wherein the width of the metal layer is larger than that of the air layer, and
the width of the air layer is larger than that of the open area.

16. An image sensing device comprising:
an array of sensor pixels to detect incident light to output pixel signals indicative of an image of the incident light;
color filters respectively formed over the sensor pixels to filter light incident to the sensor pixels, respectively; and
one or more optical grid structures disposed between adjacent color filters,
wherein each of the one or more optical grid structures comprises:
an air layer formed between the color filters; and
a first capping film structured to cover the air layer and having an open area formed on the air layer and directly connected to an outside of the color filters.

17. The image sensing device of claim 16, wherein the width of the open area is smaller than that of the air layer.

18. The image sensing device of claim 16, wherein the open area is arranged to border boundaries of each of the adjacent color filters.

19. The image sensing device of claim 16, wherein the optical grid structure further comprises a second capping film to cover the first capping film.

20. The image sensing device of claim 16, wherein a refractive index of the first capping film is higher than that of the air layer and lower than that of the color filter abutting on the optical grid structure.

* * * * *